US012323080B2

(12) United States Patent
Engelhardt et al.

(10) Patent No.: US 12,323,080 B2
(45) Date of Patent: Jun. 3, 2025

(54) SYSTEMS AND METHODS FOR DATA RECORDER FOR INVERTER FOR ELECTRIC VEHICLE

(71) Applicant: BorgWarner US Technologies LLC, Wilmington, DE (US)

(72) Inventors: Marc R. Engelhardt, Kokomo, IN (US); Peter Allan Laubenstein, Sharpsville, IN (US); Kevin M. Gertiser, Carmel, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 356 days.

(21) Appl. No.: 18/065,729

(22) Filed: Dec. 14, 2022

(65) Prior Publication Data

US 2024/0106375 A1 Mar. 28, 2024

Related U.S. Application Data

(60) Provisional application No. 63/378,601, filed on Oct. 6, 2022, provisional application No. 63/377,512, filed (Continued)

(51) Int. Cl.
*H02P 27/04* (2016.01)
*B60L 3/00* (2019.01)
(Continued)

(52) U.S. Cl.
CPC .............. *H02P 27/06* (2013.01); *B60L 3/003* (2013.01); *B60L 15/007* (2013.01); *B60L 15/08* (2013.01);

(Continued)

(58) Field of Classification Search
CPC ...... H02P 27/06; H02P 2101/45; H02P 29/66; H02P 29/027; H02P 29/0241
See application file for complete search history.

(56) References Cited

U.S. PATENT DOCUMENTS 4,054,828 A  10/1977  Conzelmann et al.
4,128,801 A  12/1978  Gansert et al.
(Continued)

FOREIGN PATENT DOCUMENTS

EP    3547531 A1 * 10/2019 ............. B60L 50/51
JP    2018177212 A * 11/2018 ......... G05B 23/0213
(Continued)

OTHER PUBLICATIONS

Anonymous: "Vehicle Electrification Solutions Semiconductors for the next generation of electric vehicles", Aug. 20, 2019 (Aug. 20, 2019), XP093046511, <<http://web.archive.org/web/20190820202323if_/https://www.nxp.com/docs/en/brochure/VEHICLE-ELECTRIFICATION-BR.pdf>>, [retrieved on May 12, 2023].
(Continued)

*Primary Examiner* — Karen Masih
(74) *Attorney, Agent, or Firm* — Joshua M. Haines; Bookoff McAndrews, PLLC

(57) ABSTRACT

A system comprises an inverter configured to convert DC power from a battery to AC power to drive a motor, wherein the inverter includes: an upper phase controller configured to store upper phase data; a lower phase controller configured to store lower phase data; and a data coherence interface providing a communication interface between the upper phase controller and the lower phase controller for data coherence between the stored upper phase data and the stored lower phase data.

20 Claims, 7 Drawing Sheets

Related U.S. Application Data on Sep. 28, 2022, provisional application No. 63/377,501, filed on Sep. 28, 2022, provisional application No. 63/377,486, filed on Sep. 28, 2022.

(51) Int. Cl.

| | |
|---|---|
| *B60L 15/00* | (2006.01) |
| *B60L 15/08* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 21/48* | (2006.01) |
| *H01L 23/00* | (2006.01) |
| *H01L 23/15* | (2006.01) |
| *H01L 23/367* | (2006.01) |
| *H01L 23/373* | (2006.01) |
| *H01L 23/40* | (2006.01) |
| *H01L 23/467* | (2006.01) |
| *H01L 23/473* | (2006.01) |
| *H01L 23/495* | (2006.01) |
| *H01L 23/538* | (2006.01) |
| *H01L 25/00* | (2006.01) |
| *H01L 25/07* | (2006.01) |
| *H02J 7/00* | (2006.01) |
| *H02M 1/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/06* | (2006.01) |
| *H02P 27/08* | (2006.01) |
| *H02P 29/024* | (2016.01) |
| *H02P 29/68* | (2016.01) |
| *H05K 1/14* | (2006.01) |
| *H05K 1/18* | (2006.01) |
| *H05K 5/02* | (2006.01) |
| *H05K 7/20* | (2006.01) |
| *H10D 64/01* | (2025.01) |
| *B60L 15/20* | (2006.01) |
| *H03K 19/20* | (2006.01) |

(52) U.S. Cl.
CPC ............... *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(56) References Cited

U.S. PATENT DOCUMENTS

| | | | |
|---|---|---|---|
| 4,564,771 | A | 1/1986 | Flohrs |
| 4,618,875 | A | 10/1986 | Flohrs |
| 4,716,304 | A | 12/1987 | Fiebig et al. |
| 5,068,703 | A | 11/1991 | Conzelmann et al. |
| 5,432,371 | A | 7/1995 | Denner et al. |
| 5,559,661 | A | 9/1996 | Meinders |
| 5,654,863 | A | 8/1997 | Davies |
| 5,764,007 | A | 6/1998 | Jones |
| 5,841,312 | A | 11/1998 | Mindl et al. |
| 6,028,470 | A | 2/2000 | Michel et al. |
| 6,163,138 | A | 12/2000 | Kohl et al. |
| 6,351,173 | B1 | 2/2002 | Ovens et al. |
| 6,426,857 | B1 | 7/2002 | Doster et al. |
| 6,597,556 | B1 | 7/2003 | Michel et al. |
| 6,812,553 | B2 | 11/2004 | Gerbsch et al. |
| 6,943,293 | B1 | 9/2005 | Jeter et al. |
| 7,095,098 | B2 | 8/2006 | Gerbsch et al. |
| 7,229,855 | B2 | 6/2007 | Murphy |
| 7,295,433 | B2 | 11/2007 | Taylor et al. |
| 7,459,954 | B2 | 12/2008 | Kuehner et al. |
| 7,538,425 | B2 | 5/2009 | Myers et al. |
| 7,551,439 | B2 | 6/2009 | Peugh et al. |
| 7,616,047 | B2 | 11/2009 | Rees et al. |
| 7,724,046 | B2 | 5/2010 | Wendt et al. |
| 7,750,720 | B2 | 7/2010 | Dittrich |
| 9,088,159 | B2 | 7/2015 | Peuser |
| 9,275,915 | B2 | 3/2016 | Heinisch et al. |
| 9,373,970 | B2 | 6/2016 | Feuerstack et al. |

(56) References Cited

U.S. PATENT DOCUMENTS

| | | |
|---|---|---|
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2017/0331469 A1 | 11/2017 | Kilb et al. |
| 2020/0195121 A1 | 6/2020 | Keskar et al. |
| 2021/0005711 A1 | 1/2021 | Martinez-Limia et al. |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

(56) References Cited

U.S. PATENT DOCUMENTS

FOREIGN PATENT DOCUMENTS

| | | | |
|---|---|---|---|
| WO | 2007093598 A1 | 8/2007 | |
| WO | 2019034505 A1 | 2/2019 | |
| WO | 2020156820 A1 | 8/2020 | |
| WO | 2020239797 A1 | 12/2020 | |
| WO | 2021110405 A1 | 6/2021 | |
| WO | 2021213728 A1 | 10/2021 | |
| WO | 2022012943 A1 | 1/2022 | |
| WO | 2022229149 A1 | 11/2022 | |
| WO | 2023006491 A1 | 2/2023 | |
| WO | 2023046607 A1 | 3/2023 | |
| WO | 2023094053 A1 | 6/2023 | |
| WO | 2023110991 A1 | 6/2023 | |
| WO | 2023147907 A1 | 8/2023 | |
| WO | 2023151850 A1 | 8/2023 | |
| WO | 2023227278 A1 | 11/2023 | |
| WO | 2023237248 A1 | 12/2023 | |
| WO | 2024006181 A2 | 1/2024 | |
| WO | 2024012743 A1 | 1/2024 | |
| WO | 2024012744 A1 | 1/2024 | |
| WO | 2024022219 A1 | 2/2024 | |
| WO | 2024041776 A1 | 2/2024 | |
| WO | 2024046614 A1 | 3/2024 | |
| WO | 2024049730 A1 | 3/2024 | |
| WO | 2024049884 A1 | 3/2024 | |
| WO | 2024049909 A1 | 3/2024 | |
| WO | 2024056388 A1 | 3/2024 | |
| WO | 2024068065 A1 | 4/2024 | |
| WO | 2024068076 A1 | 4/2024 | |
| WO | 2024068113 A1 | 4/2024 | |
| WO | 2024068115 A1 | 4/2024 | |
| WO | 2024083391 A1 | 4/2024 | |
| WO | 2024093384 A1 | 5/2024 | |
| WO | 2024104970 A1 | 5/2024 | |
| WO | 2024108401 A1 | 5/2024 | |
| WO | 2024110106 A1 | 5/2024 | |
| WO | 2024110265 A1 | 5/2024 | |
| WO | 2024110297 A1 | 5/2024 | |
| WO | 2024114978 A1 | 6/2024 | |
| WO | 2024114979 A1 | 6/2024 | |
| WO | 2024114980 A1 | 6/2024 | |
| WO | 2024128286 A1 | 6/2024 | |
| WO | 2024132249 A1 | 6/2024 | |

OTHER PUBLICATIONS

NXP Semiconductors: "MC33GD3100 Advanced IGBT/SiC gate driver v.10", Sep. 29, 2023 (Sep. 29, 2023), pp. 1-21, XP093106971, <<https://www.nxp.com/docs/en/data-sheet/MC33GD3100_SDS. pdf>>, [retrieved on Nov. 29, 2023].

NXP Semiconductors: "Getting Started with the MPC5775B-EVB and MPC5775E-EVB", May 2, 2020 (May 2, 2020), pp. 1-33, XP093106974, <<https://www.nxp.com/docs/en/application-note/AN12875.pdf>>, [retrieved on Nov. 29, 2023].

Balogh, L., "Fundamentals of MOSFET and IGBT Gate Driver Circuits," Texas Instruments Application Report, SLUA618-March (2017), Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616 ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

\* cited by examiner

SYSTEMS AND METHODS FOR DATA RECORDER FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for data recording for an inverter for an electric vehicle, and, more particularly, to techniques for maintaining coherence between saved data in integrated circuits in the event of a fault.

BACKGROUND

Inverters, such as those used to drive a motor in an electric vehicle, for example, are responsible for converting High Voltage Direct Current (HVDC) into Alternating Current (AC) to drive the motor. In an inverter, such as a three-phase motor controller, for example, determining a cause of an issue may be difficult in the event of a fault in the system that prevents proper operation.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: an upper phase controller configured to store upper phase data; a lower phase controller configured to store lower phase data; and a data coherence interface providing a communication interface between the upper phase controller and the lower phase controller for data coherence between the stored upper phase data and the stored lower phase data.

In some aspects, the techniques described herein relate to a system, further including: a galvanic isolator separating a high voltage area from a low voltage area, wherein the upper phase controller includes a low voltage upper phase controller in the low voltage area and a high voltage upper phase controller in the high voltage area, and wherein the lower phase controller includes a low voltage lower phase controller in the low voltage area and a high voltage lower phase controller in the high voltage area.

In some aspects, the techniques described herein relate to a system, wherein the low voltage upper phase controller is configured to store the upper phase data; the low voltage lower phase controller is configured to store the store lower phase data; and the data coherence interface provides a communication interface between the low voltage upper phase controller and the low voltage lower phase controller for data coherence between the stored upper phase data and the stored lower phase data.

In some aspects, the techniques described herein relate to a system, further including: a point-of-use upper phase controller configured to communicate with the high voltage upper phase controller, wherein the point-of-use upper phase controller is configured to provide one or more of a temperature of an upper phase power switch of the inverter or a current level in an upper phase power switch of the inverter to the high voltage upper phase controller for the upper phase data; and a point-of-use lower phase controller configured to communicate with the high voltage lower phase controller, wherein the point-of-use lower phase controller is configured to provide one or more of a temperature of a lower phase power switch of the inverter or a current level in a lower phase power switch of the inverter to the high voltage lower phase controller for the lower phase data.

In some aspects, the techniques described herein relate to a system, further including: an inverter controller, wherein the data coherence interface further provides a communication interface between the upper phase controller, the lower phase controller, and the inverter controller.

In some aspects, the techniques described herein relate to a system, further including: an upper Serial Peripheral Interface (SPI); and a lower Serial Peripheral Interface (SPI), wherein the upper SPI and the lower SPI provide communication interfaces from the inverter controller to the upper phase controller and the lower phase controller, respectively.

In some aspects, the techniques described herein relate to a system, wherein the upper phase controller and the lower phase controller are configured to signal an inverter controller, using the data coherence interface, to read the stored upper phase data and the stored lower phase data using the upper SPI and the lower SPI, respectively.

In some aspects, the techniques described herein relate to a system, wherein the upper phase controller and the lower phase controller are configured to periodically update the stored upper phase data and the stored lower phase data.

In some aspects, the techniques described herein relate to a system, wherein each of the upper phase controller and the lower phase controller are configured to signal the other of the upper phase controller and the lower phase controller, using the data coherence interface, to freeze the stored upper phase data and the stored lower phase data so that the periodic updates are stopped.

In some aspects, the techniques described herein relate to a system, wherein the upper phase controller and the lower phase controller are configured to signal an inverter controller, using the data coherence interface, to read the stored upper phase data and the stored lower phase data when the periodic updates are stopped.

In some aspects, the techniques described herein relate to a system, wherein the upper phase controller and the lower phase controller are configured to signal the other of the upper phase controller and the lower phase controller, using the data coherence interface, to freeze the stored upper phase data and the stored lower phase data when a fault is detected by the respective upper phase controller or lower phase controller.

In some aspects, the techniques described herein relate to a system, wherein one or more of the upper phase data or the lower phase data includes one or more of a commanded pulse width modulation (PWM) on-time, a commanded PWM duty cycle, a temperature of a power switch of the inverter, a current level in the power switch of the inverter, a type of a fault, or a diagnostic associated with a fault.

In some aspects, the techniques described herein relate to a system, wherein the upper phase controller and the lower phase controller are configured to store one or more of the commanded PWM on-time or the commanded PWM duty cycle at a PWM rate, and wherein the upper phase controller and the lower phase controller are configured to align the respective stored upper phase data and the stored lower phase data in time with one or more of the commanded PWM on-time or the commanded PWM duty cycle.

In some aspects, the techniques described herein relate to a system, further including: the battery configured to supply the DC power to the inverter; and the motor configured to receive the AC power from the inverter to drive the motor.

In some aspects, the techniques described herein relate to a first phase controller for an inverter for an electric vehicle, the first phase controller configured to: store data related to the first phase controller, and periodically update the stored data; and one or more of: detect a fault, and provide, upon detection of the fault, a signal to a second phase controller for the inverter to freeze stored data in the second phase controller; or receive a signal from the second phase controller to freeze the stored data in the first phase controller so that the periodic update is stopped.

In some aspects, the techniques described herein relate to a first phase controller, wherein the first phase controller is further configured to: provide a signal to an inverter controller for the inverter to read the stored data in the first phase controller and the stored data in the second phase controller.

In some aspects, the techniques described herein relate to a method including: storing, by a first phase controller for an inverter for an electric vehicle, data related to the first phase controller, and periodically updating the stored data; detecting, by the first phase controller, a fault; and providing, by the first phase controller upon detection of the fault, a signal to a second phase controller for the inverter to freeze stored data in the second phase controller.

In some aspects, the techniques described herein relate to a method, further including: providing, by the first phase controller, a signal to an inverter controller for the inverter to read the stored data in the first phase controller and the stored data in the second phase controller.

In some aspects, the techniques described herein relate to a method, further including: receiving, by the first phase controller, a signal from the second phase controller to freeze the stored data in the first phase controller so that the periodic update is stopped.

In some aspects, the techniques described herein relate to a method, further including: receiving, by the first phase controller from a point-of-use phase controller for the inverter, data related to a power switch for the inverter; and updating the stored data in the first phase controller with the received data related to the power switch for the inverter.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
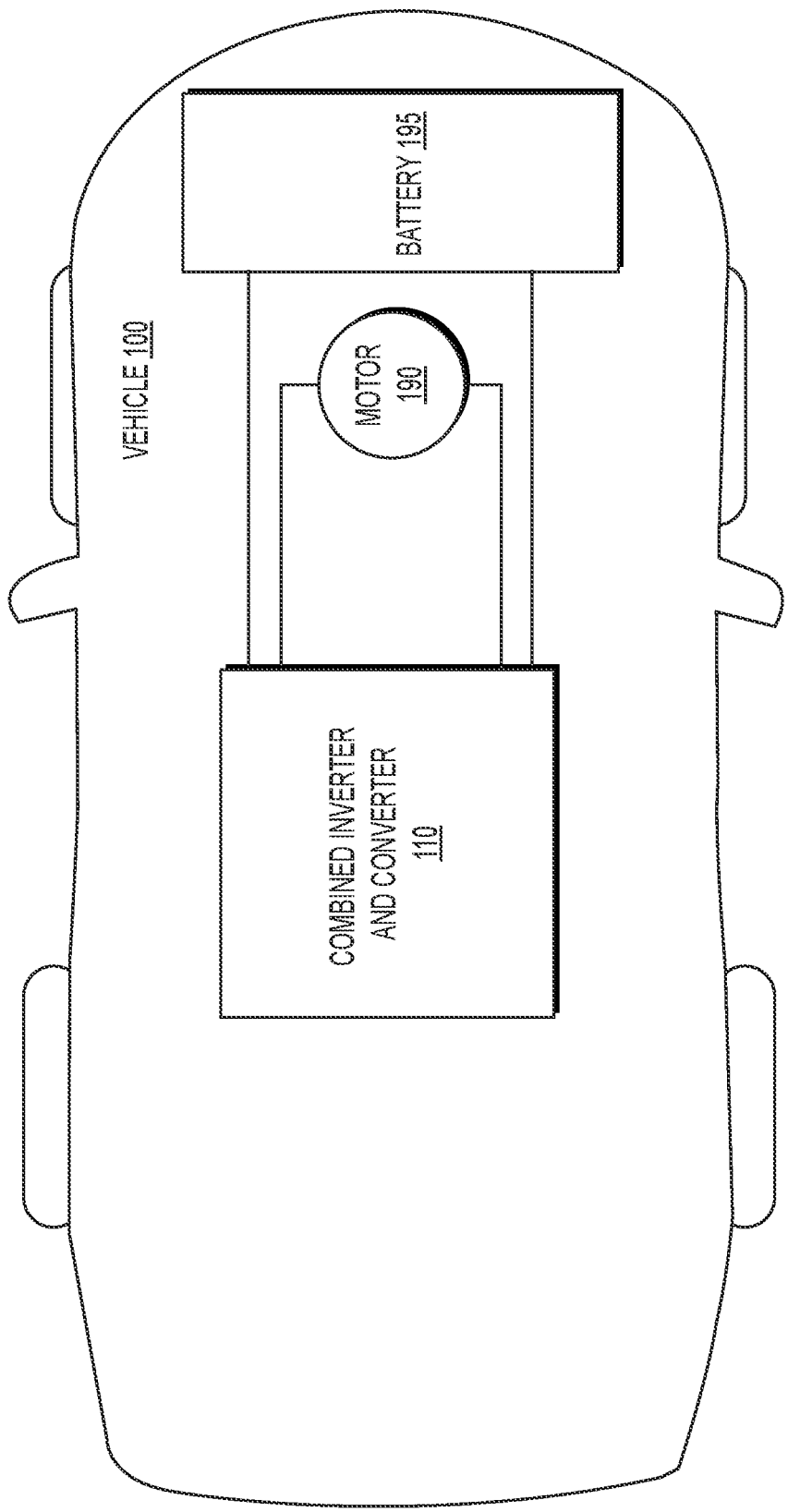
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for data recording for an inverter for an electric vehicle, and, more particularly, to techniques for maintaining coherence between saved data in integrated circuits in the event of a fault.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

In motor controllers, such as a three-phase inverter, for example, determining a cause of an issue may be difficult in the event of a fault in the system that prevents proper operation. This difficulty may be due to a lack of time-aligned parameter data between an upper phase switch and a lower phase switch over a sufficient period of time. Consequently, there may be insufficient parameter data to understand and recreate parameter data that led to the improper operation. In addition, some severe faults may lead to destruction of a gate driver of the motor controller, along with any information that may have been stored within the gate driver.

One or more embodiments may store data related to the power switch in a low-voltage area of the controller that is less likely to be affected by a catastrophic failure of the power switch. One or more embodiments of the disclosure may store parameter data for debugging an improper operation of the motor controller. The parameter data may be stored at a periodic rate with a depth of data sufficient for recreation of faulted conditions. The stored parameter data may include, for example, one or more of a commanded PWM on-time, a commanded PWM duty cycle, a temperature of a power switch of the controller, a current level in the power switch, or a type of a fault or diagnostic which occurred in the controller. The commanded PWM on-time and duty cycle calculation may be performed by a controller that is physically remote from the power switch, such as in a low-voltage area of the controller that is less likely to be affected by a catastrophic failure of the power switch. The commanded PWM on-time and duty cycle calculation may be calculated and stored at a PWM rate. The controller for the three phase motor will control both the PWM frequency and duty cycle. The PWM frequency may be fixed, or may be adjusted by the controller based upon the RPM of the motor, for example. The PWM rate may range from approximately 6 KHz to approximately 25 KHz, for example. The duty cycle of the PWM pulses may range from a 0% duty cycle to a 100% duty cycle. The duty cycle commanded may be a function of the motor control algorithm and the torque desired, and may be based upon user request, for example. To increase torque output, the upper phase switch duty-cycle may be increased to be greater than 50% and the lower phase switch duty-cycle may be decreased to be below 50% for a forward direction of the motor. For a reverse direction of the motor, the lower phase switch duty cycle may be increased above 50% and the upper phase duty cycle may be decreased below 50%. The current waveform may be managed with the phase of the motor to produce the desired torque. Control methodologies may include space vector modulation or six step control, for example.

The temperature and current level of the power switch may be measured locally to the power switch, such as in a power module including both a switch controller and the power switch. Data may be sent from the power module switch controller to the remote controller on a periodic basis. For example, data may be sent from the power module switch controller to the remote controller at approximately a 200 µs to 300 µs rate. The data may be sent based on a request from the remote controller. The data may be interspersed between other messages being communicated between the power module switch controller and the remote controller. The periodic data needed by the remote controller may be the temperature of the power switch and the measured current level. A 200 µs to 300 µs rate may provide enough readings for the remote controller to average at least two to three readings for increased immunity to noise. The data sent from the power module switch controller may be protected by galvanic isolation when a fault on a high voltage side of the power switch occurs. The data sent from the power module switch controller may be aligned in time with PWM on-time and PWM period measured within the remote controller. Ideally, data would be returned from the power module switch controller for every PWM cycle. However, with a PWM rate of 25 KHz, for example, this would require the data to be saved and sent to the remote controller every 40 µs. Therefore, as data may not be sent for every PWM cycle, the data may be aligned in time in the upper and lower remote controllers using a time-stamp of each of reading received from the power module switch controller. This allows data within equivalent register positions in the upper and lower remote controllers to be aligned in time. Each remote controller may be responsible for keeping track of the accumulated PWM on-time and the number of PWM edges that have been observed within a power module switch controller data reporting period. The accumulated on-time and the number of edges between power module switch controller data reporting may be stored in the upper and lower remote controllers with data in time alignment with the upper and lower phases. This enables post-failure reconstruction and understanding of the conditions preceding a potential fault. Additionally, the data alignment occurs in the low voltage domain via an independent time stamp within each of the upper and lower remote controllers. If a fault has been detected on either an upper or a lower phase of the controller, a communication interface between the phases may signal respective remote controllers to freeze the saved data so that the periodic updates are stopped, and alert a higher level controller to read the frozen data, such as via a Serial Peripheral Interface (SPI), for example. This data freeze may maintain data in the upper and lower phases in coherence with each other. The upper and lower remote controllers may disallow the acceptance of new data until after the higher level controller has read the frozen data. This data freeze may allow data of interest to be saved and not overwritten with data that follows a fault.

Integrated circuits of an inverter of an electric vehicle may store parameter data during operation of the electric vehicle. The integrated circuits might implement memory management techniques to store the parameter data. For example, the integrated circuits might implement first in, first out (FIFO) memory management in which older data is replaced by newer data. For example, each data register of the FIFO may include a time stamp from the remote controller, an on-time from the remote controller, a PWM edge count from the remote controller, a fault group from the remote controller, a temperature from the power module switch controller, and other selected data from the power module switch controller. The FIFO may include five or more data registers, for example. In the event of a fault of one of the integrated circuits, another integrated circuit might remove parameter data that is time-aligned with parameter data of the integrated circuit associated with the fault. Accordingly, as addressed above, there might be insufficient time-aligned parameter data between the integrated circuits to diagnose the fault. One or more embodiments may provide techniques to record parameter data in the event of a fault. In this way, one or more embodiments may improve data retention and accuracy, and improve fault diagnosis.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
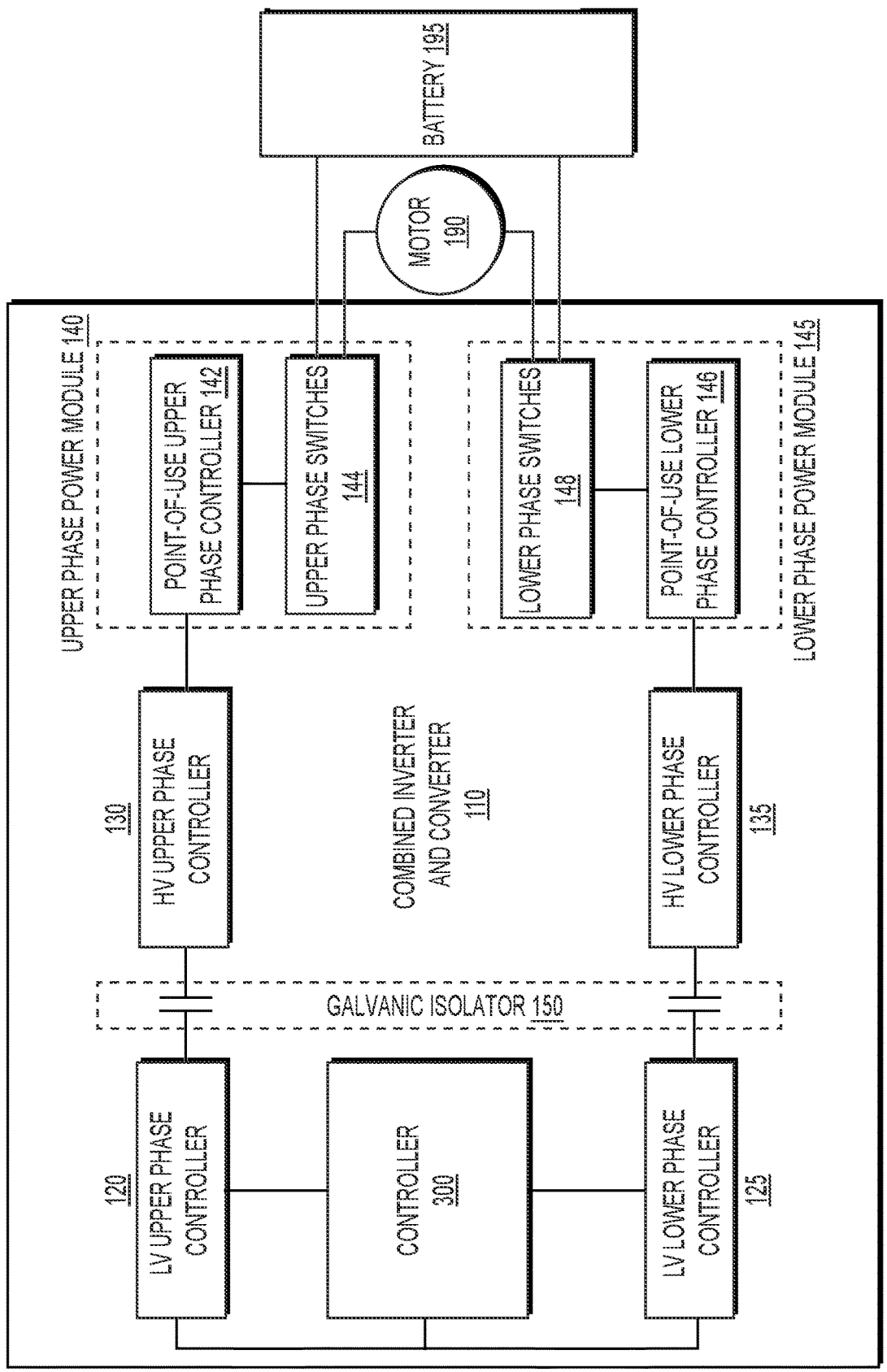
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
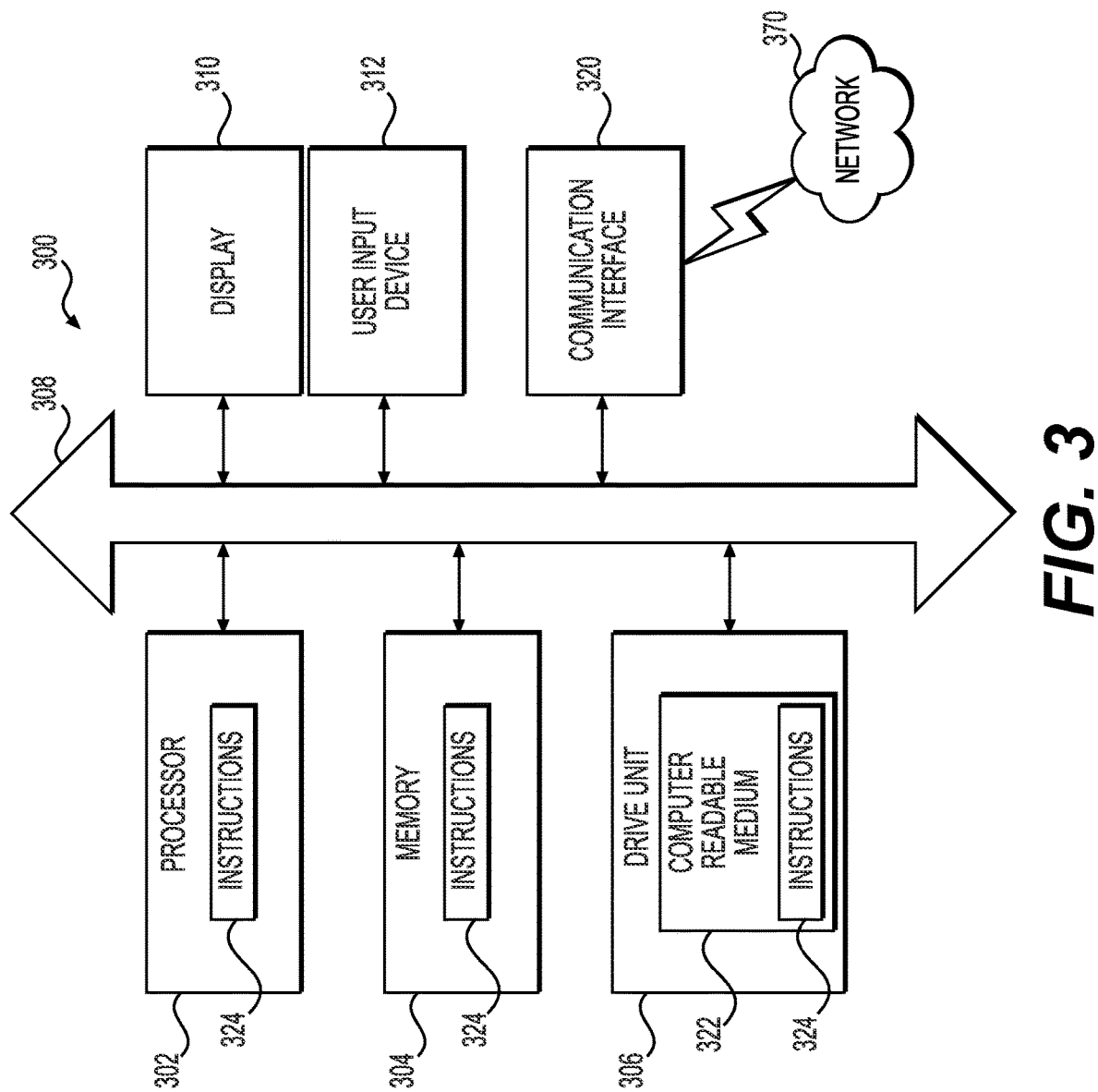
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
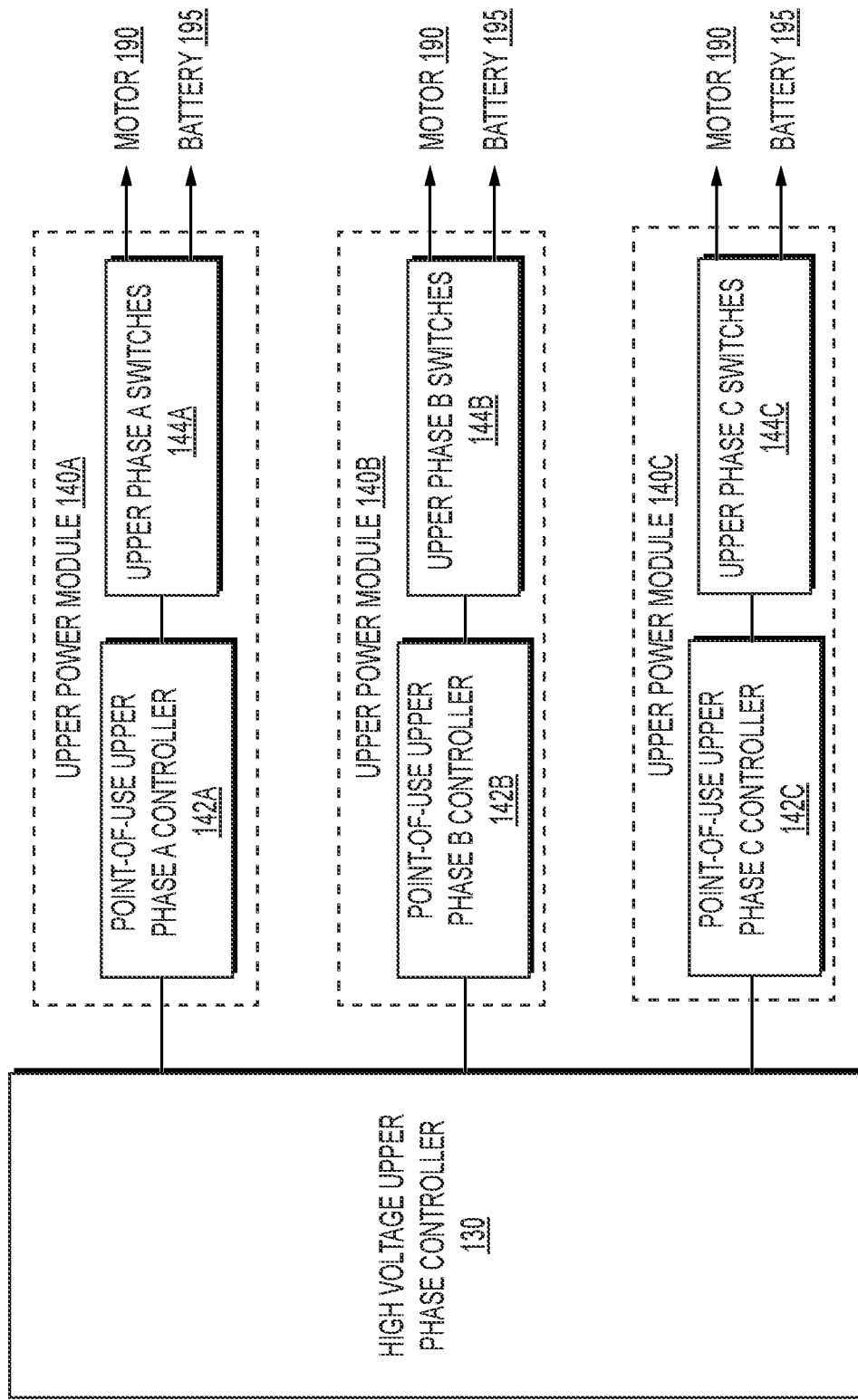
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
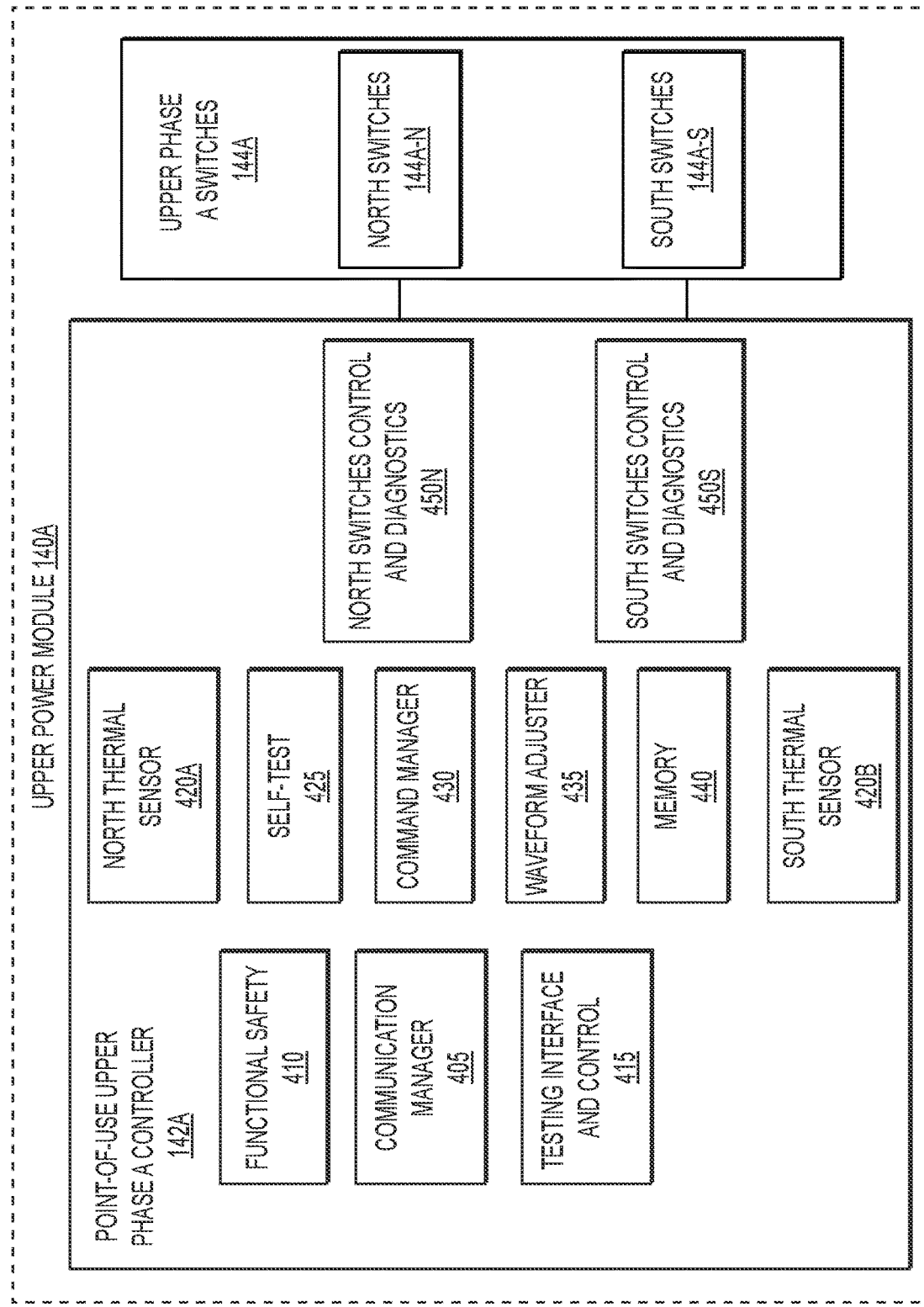
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
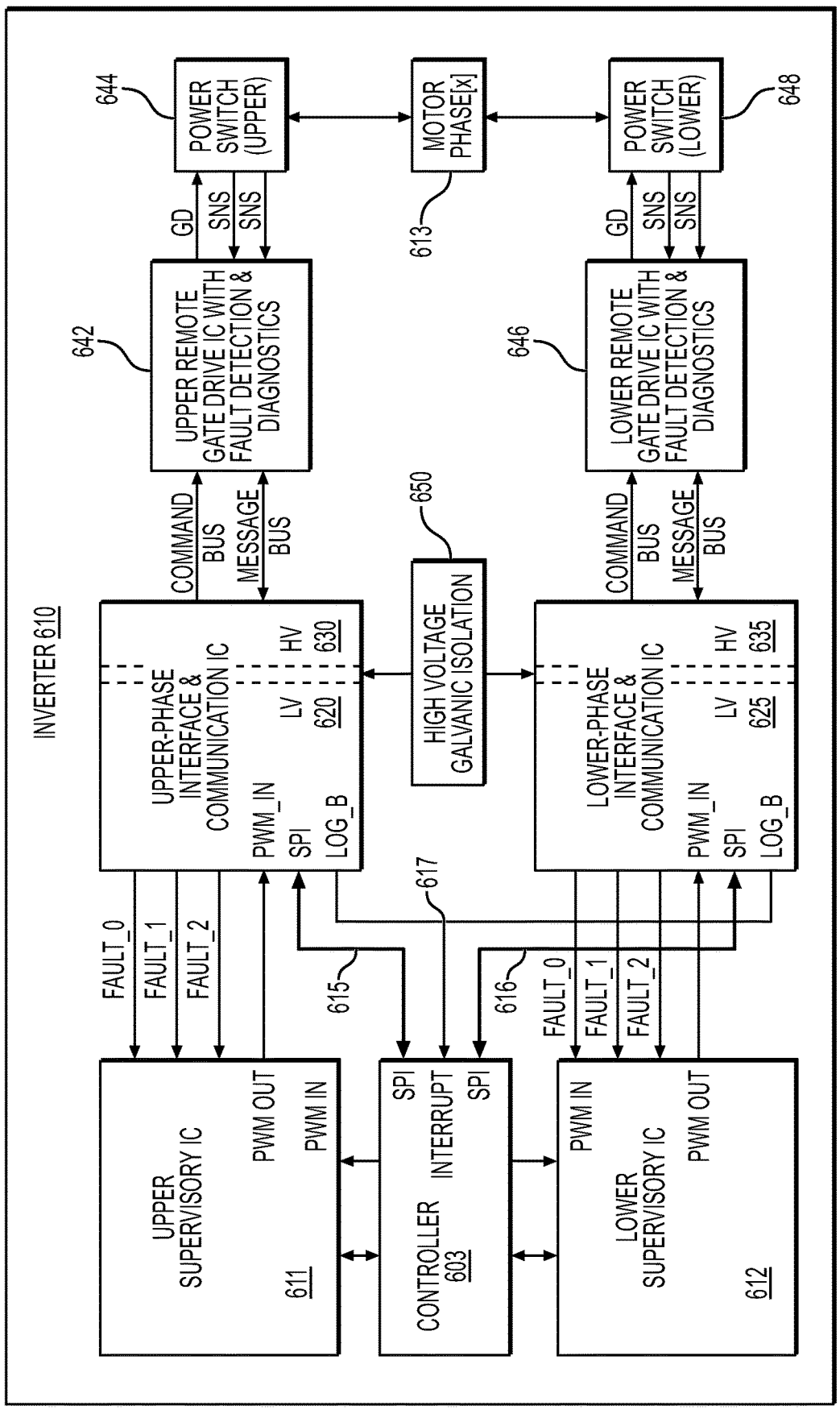
FIG. 6 depicts an exemplary system infrastructure for an inverter with a data coherence interface, according to one or more embodiments.

FIG. 6 depicts an exemplary system infrastructure for an inverter with a data coherence interface, according to one or more embodiments. As shown in FIG. 1, electric vehicle 100 may include motor 190 and battery 195, and as shown in FIG. 6, inverter 610. Inverter 610 may be similar to inverter 110 described above, and may include inverter controller 603 (similar to inverter controller 300 as shown in FIG. 3) to control the inverter 610. Inverter 610 may include a low voltage upper phase controller 620 (similar to low voltage upper phase controller 120) separated from a high voltage upper phase controller 630 (similar to high voltage upper phase controller 130) by a galvanic isolator 650 (similar to galvanic isolator 150), a point-of-use upper phase controller 642 (similar to point-of-use upper phase controller 142), and upper phase switches 644 (similar to upper phase switches 144).

Inverter 610 may include a low voltage lower phase controller 625 (similar to low voltage lower phase controller 125) separated from a high voltage lower phase controller 635 (similar to high voltage lower phase controller 135) by galvanic isolator 650, a point-of-use lower phase controller 646 (similar to point-of-use lower phase controller 146), and lower phase switches 648 (similar to lower phase switches 148). Upper phase switches 644 and lower phase switches 648 may be connected to motor 190 through motor phase connections 613.

Inverter 610 may include an upper supervisory controller 611 in communication with inverter controller 603 and low voltage upper phase controller 620, and a lower supervisory controller 612 in communication with inverter controller 603 and low voltage lower phase controller 625. Inverter 610 may include upper SPI 615 and lower SPI 616 providing communication interfaces from inverter controller 603 to low voltage upper phase controller 620 and to low voltage lower phase controller 625, respectively. Inverter 610 may include data coherence interface 617 providing communication interfaces from low voltage upper phase controller 620 to inverter controller 603, from low voltage lower phase controller 625 to inverter controller 603, from low voltage upper phase controller 620 to low voltage lower phase controller 625, and from low voltage lower phase controller 625 to low voltage upper phase controller 620.

Inverter 610 may include a low voltage area, where voltages are generally less than 5V, for example, and a high voltage area, where voltages may exceed 500V, for example. The low voltage area may be separated from the high voltage area by galvanic isolator 650. Inverter controller 603 may be in the low voltage area of inverter 610, and may send signals to and receive signals from low voltage upper phase controller 620. Low voltage upper phase controller 620 may be in the low voltage area of inverter 610, and may send signals to and receive signals from high voltage upper phase controller 630. Low voltage upper phase controller 620 may send signals to and receive signals from low voltage lower phase controller 625.

High voltage upper phase controller 630 may be in the high voltage area of inverter 610. Accordingly, signals between low voltage upper phase controller 620 and high voltage upper phase controller 630 pass through galvanic isolator 650. High voltage upper phase controller 630 may send signals to and receive signals from point-of-use upper phase controller 642.

Point-of-use upper phase controller 642 may send signals to and receive signals from upper phase switches 644. Upper phase switches 644 may be connected to motor 190 and battery 195. Upper phase switches 644 and lower phase switches 648 may be used to transfer energy from motor 190 to battery 195, from battery 195 to motor 190, from an external source to battery 195, or from battery 195 to an external source, for example. The lower phase system of inverter 610 may be similar to the upper phase system as described above.

One or more embodiments of the disclosure may store parameter data for debugging an improper operation of the inverter 610. The parameter data may be stored at a periodic rate with a depth of data sufficient for recreation of faulted conditions. The stored parameter data may include one or more of a commanded PWM on-time, a commanded PWM duty cycle, a temperature of a power switch (e.g. upper phase switches 644), a current level in the power switch, or a type of a fault or diagnostic which occurred in the point-of-use phase controller (e.g. point-of-use upper phase controller 642).

The commanded PWM on-time and duty cycle calculation may be performed by a controller (e.g. low voltage upper phase controller 620) that is physically remote from the power switch, such as in a low-voltage area of the inverter 610 that is less likely to be affected by a catastrophic failure of the power switch. The commanded PWM on-time and duty cycle calculation may be calculated and stored at a PWM rate.

The temperature and current level of the power switch may be measured locally to the power switch, such as in a power module including a switch controller (e.g. point-of-use upper phase controller 642) and the power switch (e.g. upper phase switches 644). Data may be sent from the switch controller (e.g. point-of-use upper phase controller 642) to the remote controller (e.g. to high voltage upper phase controller 630 and on to low voltage upper phase controller 620) on a periodic basis. The data sent from the power switch may be protected by galvanic isolation (e.g. galvanic isolator 650) when a fault on a high voltage side of the power switch occurs.

The data sent from the power switch may be aligned in time with PWM on-time and PWM period measured within the remote controller (e.g. low voltage upper phase controller 620). If a fault has been detected on either an upper phase controller (e.g. low voltage upper phase controller 620) or a lower phase controller (e.g. low voltage lower phase controller 625), data coherence interface 617 between the phases may signal the respective remote controllers (e.g. low voltage upper phase controller 620 and low voltage lower phase controller 625) to freeze the saved data, and alert inverter controller 603 to read the frozen data using SPI 615 and SPI 616, for example. This data freeze may maintain data in the upper and lower phases in coherence with each other.

Figure 7:
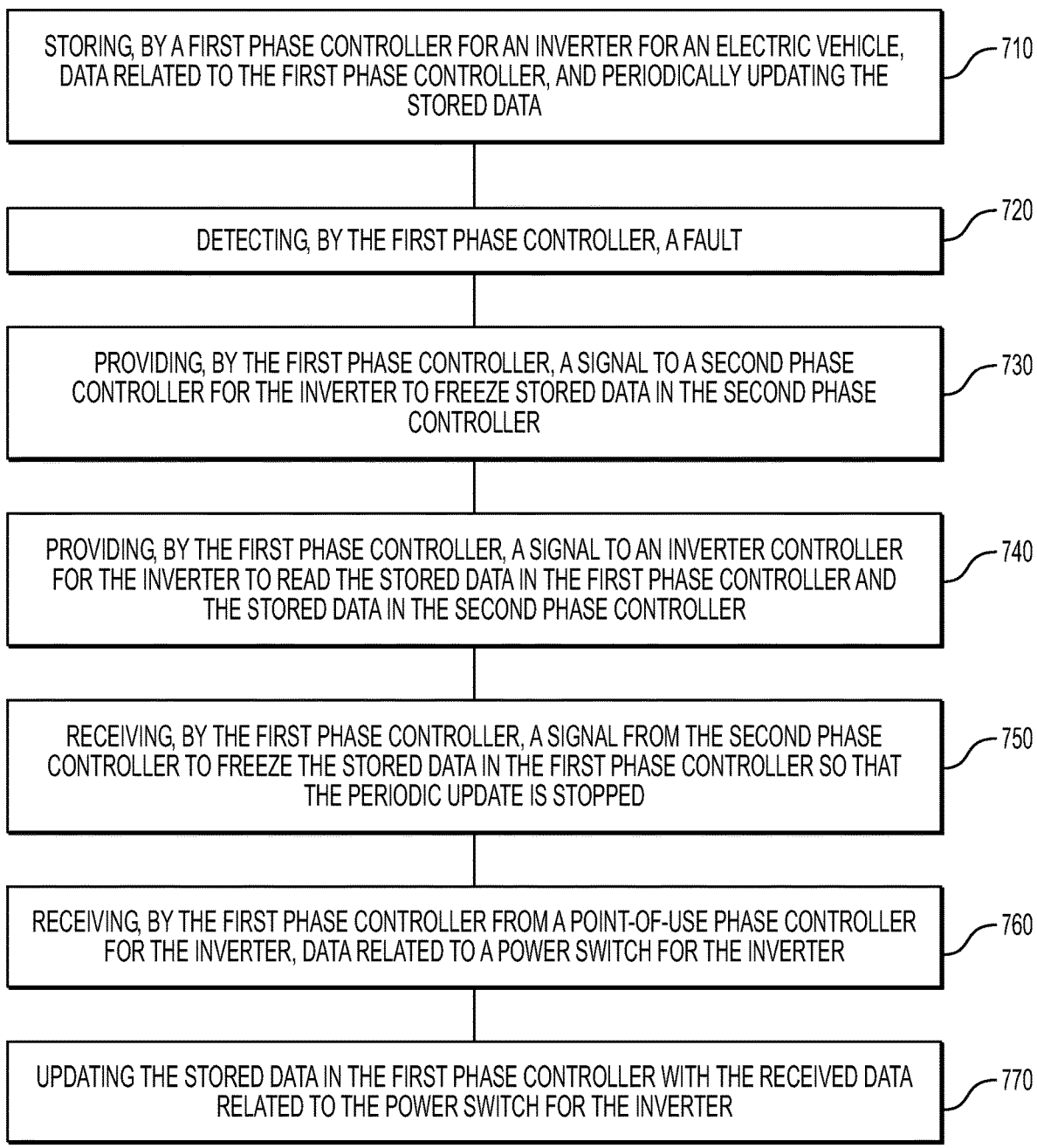
FIG. 7 depicts an exemplary method for recording data using a data coherence interface, according to one or more embodiments.

FIG. 7 depicts a method for recording data using a data coherence interface, according to one or more embodiments. Method 700 may include storing, by a first phase controller (e.g. low voltage upper phase controller 620) for an inverter 610 for an electric vehicle 100, data related to the first phase controller, and periodically updating the stored data (operation 710). The stored parameter data may include one or more of a commanded PWM on-time, a commanded PWM duty cycle, a temperature of a power switch (e.g. upper phase switches 644), a current level in the power switch, or a type of a fault or diagnostic which occurred in the point-of-use phase controller (e.g. point-of-use upper phase controller 642).

Method 700 may include detecting, by the first phase controller, a fault (operation 720). Method 700 may include providing, by the first phase controller, a signal to a second phase controller (e.g. low voltage lower phase controller 625) for the inverter 110 to freeze stored data in the second phase controller (operation 730). The signal to the second phase controller may be provided using data coherence interface 617. Method 700 may include providing, by the first phase controller, a signal to an inverter controller 603 for the inverter 610 to read the stored data in the first phase controller (e.g. low voltage upper phase controller 620) and the stored data in the second phase controller (e.g. low voltage lower phase controller 625) (operation 740). The signal to the inverter controller 603 may be provided using data coherence interface 617, and the inverter controller 603 may read the data using SPI 615 and SPI 616.

Method 700 may include receiving, by the first phase controller, a signal from the second phase controller to freeze the stored data in the first phase controller so that the periodic update is stopped (operation 750). The signal from the second phase controller may be received using data coherence interface 617. Method 700 may include receiving, by the first phase controller from a point-of-use phase controller (e.g. point-of-use upper phase controller 642) for the inverter 610, data related to a power switch (e.g. upper phase switches 644) for the inverter 610 (operation 760). Method 700 may include updating the stored data in the first phase controller with the received data related to the power switch for the inverter 610 (operation 770). The data related to the power switch may include a temperature and current level of the power switch, which may be measured locally to the power switch (e.g. by point-of-use upper phase controller 642 for upper phase switches 644). The data related to the power switch may be sent from the point-of-use upper phase controller 642 to the first phase controller (e.g. to high voltage upper phase controller 630 and on to low voltage upper phase controller 620).

One or more embodiments may store data related to the power switch in a low-voltage area of the controller that is less likely to be affected by a catastrophic failure of the power switch. One or more embodiments of the disclosure may store parameter data for debugging an improper operation of the motor controller. The parameter data may be stored at a periodic rate with a depth of data sufficient for recreation of faulted conditions. One or more embodiments may provide a technique for data recording for an inverter for an electric vehicle. One or more embodiments may provide a technique of maintaining coherence between saved data in integrated circuits in the event of a fault. In this way, one or more embodiments may improve data retention and accuracy, and improve fault diagnosis.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
an upper phase controller configured to store upper phase data;
a lower phase controller configured to store lower phase data; and
a data coherence interface providing a communication interface between the upper phase controller and the lower phase controller for data coherence between the stored upper phase data and the stored lower phase data.

2. The system of claim 1, further comprising:
a galvanic isolator separating a high voltage area from a low voltage area,
wherein the upper phase controller includes a low voltage upper phase controller in the low voltage area and a high voltage upper phase controller in the high voltage area, and
wherein the lower phase controller includes a low voltage lower phase controller in the low voltage area and a high voltage lower phase controller in the high voltage area.

3. The system of claim 2, wherein
the low voltage upper phase controller is configured to store the upper phase data;
the low voltage lower phase controller is configured to store the store lower phase data; and
the data coherence interface provides a communication interface between the low voltage upper phase controller and the low voltage lower phase controller for data coherence between the stored upper phase data and the stored lower phase data.

4. The system of claim 3, further comprising:
a point-of-use upper phase controller configured to communicate with the high voltage upper phase controller, wherein the point-of-use upper phase controller is configured to provide one or more of a temperature of an upper phase power switch of the inverter or a current level in an upper phase power switch of the inverter to the high voltage upper phase controller for the upper phase data; and
a point-of-use lower phase controller configured to communicate with the high voltage lower phase controller, wherein the point-of-use lower phase controller is configured to provide one or more of a temperature of a lower phase power switch of the inverter or a current level in a lower phase power switch of the inverter to the high voltage lower phase controller for the lower phase data.

5. The system of claim 1, further comprising:
an inverter controller,
wherein the data coherence interface further provides a communication interface between the upper phase controller, the lower phase controller, and the inverter controller.

6. The system of claim 5, further comprising:
an upper Serial Peripheral Interface (SPI); and
a lower Serial Peripheral Interface (SPI),
wherein the upper SPI and the lower SPI provide communication interfaces from the inverter controller to the upper phase controller and the lower phase controller, respectively.

7. The system of claim 6, wherein the upper phase controller and the lower phase controller are configured to signal an inverter controller, using the data coherence interface, to read the stored upper phase data and the stored lower phase data using the upper SPI and the lower SPI, respectively.

8. The system of claim 1, wherein the upper phase controller and the lower phase controller are configured to periodically update the stored upper phase data and the stored lower phase data.

9. The system of claim 8, wherein each of the upper phase controller and the lower phase controller are configured to signal the other of the upper phase controller and the lower phase controller, using the data coherence interface, to freeze the stored upper phase data and the stored lower phase data so that the periodic updates are stopped.

10. The system of claim 9, wherein the upper phase controller and the lower phase controller are configured to signal an inverter controller, using the data coherence interface, to read the stored upper phase data and the stored lower phase data when the periodic updates are stopped.

11. The system of claim 10, wherein the upper phase controller and the lower phase controller are configured to signal the other of the upper phase controller and the lower phase controller, using the data coherence interface, to freeze the stored upper phase data and the stored lower phase data when a fault is detected by the respective upper phase controller or lower phase controller.

12. The system of claim 1, wherein one or more of the upper phase data or the lower phase data includes one or more of a commanded pulse width modulation (PWM) on-time, a commanded PWM duty cycle, a temperature of a power switch of the inverter, a current level in the power switch of the inverter, a type of a fault, or a diagnostic associated with a fault.

13. The system of claim 12, wherein the upper phase controller and the lower phase controller are configured to store one or more of the commanded PWM on-time or the commanded PWM duty cycle at a PWM rate, and wherein the upper phase controller and the lower phase controller are configured to align the respective stored upper phase data and the stored lower phase data in time with one or more of the commanded PWM on-time or the commanded PWM duty cycle.

14. The system of claim 1, further comprising:

the battery configured to supply the DC power to the inverter; and the motor configured to receive the AC power from the inverter to drive the motor.

15. A first phase controller for an inverter for an electric vehicle, the first phase controller configured to:

store data related to the first phase controller, and periodically update the stored data; and one or more of:

detect a fault, and provide, upon detection of the fault, a signal to a second phase controller for the inverter to freeze stored data in the second phase controller; or receive a signal from the second phase controller to freeze the stored data in the first phase controller so that the periodic update is stopped.

16. The first phase controller of claim 15, wherein the first phase controller is further configured to:

provide a signal to an inverter controller for the inverter to read the stored data in the first phase controller and the stored data in the second phase controller.

17. A method comprising:

storing, by a first phase controller for an inverter for an electric vehicle, data related to the first phase controller, and periodically updating the stored data;

detecting, by the first phase controller, a fault; and providing, by the first phase controller upon detection of the fault, a signal to a second phase controller for the inverter to freeze stored data in the second phase controller.

18. The method of claim 17, further comprising:

providing, by the first phase controller, a signal to an inverter controller for the inverter to read the stored data in the first phase controller and the stored data in the second phase controller.

19. The method of claim 17, further comprising:

receiving, by the first phase controller, a signal from the second phase controller to freeze the stored data in the first phase controller so that the periodic update is stopped.

20. The method of claim 17, further comprising:

receiving, by the first phase controller from a point-of-use phase controller for the inverter, data related to a power switch for the inverter; and updating the stored data in the first phase controller with the received data related to the power switch for the inverter.

* * * * *

UNITED STATES PATENT AND TRADEMARK OFFICE
CERTIFICATE OF CORRECTION

PATENT NO. : 12,323,080 B2
APPLICATION NO. : 18/065729
DATED : June 3, 2025
INVENTOR(S) : Marc R. Engelhardt et al.

Page 1 of 1

It is certified that error appears in the above-identified patent and that said Letters Patent is hereby corrected as shown below:

In the Claims

Column 17, Line 65, in Claim 3, after "store the", delete "store".

Signed and Sealed this
Twelfth Day of August, 2025

Coke Morgan Stewart
*Acting Director of the United States Patent and Trademark Office*